United States Patent [19]
Mutoh et al.

[11] Patent Number: 5,774,182
[45] Date of Patent: Jun. 30, 1998

[54] SOLID-STATE IMAGE SENSOR DEVICE WITH PIXEL ARRAY STRUCTURE OF INTERLINE TRANSFER CCD IMAGE SENSOR

[75] Inventors: Nobuhiko Mutoh; Nobukazu Teranishi, both of Tokyo, Japan

[73] Assignee: NEC Corporation, Japan

[21] Appl. No.: 501,257

[22] Filed: Jul. 11, 1995

[30] Foreign Application Priority Data

Jul. 28, 1994 [JP] Japan ................................. 6-176388

[51] Int. Cl.$^6$ ................................................. H04N 3/14
[52] U.S. Cl. ........................ 348/311; 348/315; 257/231
[58] Field of Search .................................. 348/311, 315, 348/241; 257/230, 216, 217, 218, 231, 220; H04N 5/335

[56] References Cited

U.S. PATENT DOCUMENTS

| 5,014,132 | 5/1991 | Kumesawa et al. ..................... 348/311 |
| 5,471,246 | 11/1995 | Nishima et al. ........................ 348/311 |

FOREIGN PATENT DOCUMENTS

| 5-82770 | 4/1993 | Japan . | |
| 05336453 | 12/1993 | Japan .............................. | H04N 5/335 |
| 06209099 | 7/1994 | Japan .............................. | H04N 5/335 |

OTHER PUBLICATIONS

"A High–Packing Density Pixel with Punchthrough Read-Out Method for an HDTV Interline CCD" Oxaki et al; IEEE Transaction on Electron Devices, vol. 41, No. 7; Jul. 1994.

"A 1/4 inch 380k Pixel IT–CCD Image Sensor Employing Gate–Assisted Punchthrough Read–Out Mode" Mutoh et al;International Electron Devices meeting, Dec. 5–8, 1993 pp. 563–566.

"A High Packing Density Pixel With Punchthrough Read–Out Method For An HDTV Interline–CCD" Ozaki et al; Central Research Laboratory, Jul. 1994.

Primary Examiner—Wendy Garber
Attorney, Agent, or Firm—Hayes, Soloway, Hennessey, Grossman & Hage, P.C.

[57] ABSTRACT

The solid-state image sensor device includes a photodiode section having a storage region of a second conductivity type and a surface layer of a first conductivity type, a vertical CCD register having a buried layer of the second conductivity type and a plurality of transfer electrodes, and a transfer gate having a transfer gate electrode. A channel control region of the second conductivity type is provided on a surface of the semiconductor substrate region covered by the transfer gate. With the channel control region of the second conductivity type provided at a surface portion of the semiconductor substrate region of the transfer gate, the charge read-out channel for reading out charge from the storage region into the buried layer may be readily formed. Thus, it is possible to reduce the read-out voltage or reduce the gate length of the transfer gate.

3 Claims, 2 Drawing Sheets

SOLID-STATE IMAGE SENSOR DEVICE WITH PIXEL ARRAY STRUCTURE OF INTERLINE TRANSFER CCD IMAGE SENSOR

BACKGROUND OF THE INVENTION

(1) Field of the Invention

The present invention relates to solid-state image sensor devices, and more particularly to pixel array structures of interline transfer Charge-Coupled Device (hereinafter referred to as "CCD") image sensors.

(2) Description of the Related Art

An interline transfer CCD image sensor which is provided with a vertical overflow drain structure for preventing blooming is shown in a schematic plan view in FIG. 1. FIG. 2 is a sectional view taken along line 2—2 in FIG. 1. In the following description, the image sensor is assumed to be of N-channel type wherein signal charge is constituted by electrons, but the same applies to the P-channel type. Referring to FIG. 1, there is shown a two-dimensional pixel array. Each pixel includes a photodiode section 30 which photoelectrically converts incident light and stores the resultant electric signal therein. Vertical CCD registers 32 are formed at predetermined intervals and they correspond with respective columns of the photodiode sections 30.

Referring to FIG. 1, in each pixel structure, a transfer gate 31 is provided between the photodiode section 30 and the vertical CCD register 32 to control the transfer of signal charge from the photodiode section 30 to the vertical CCD register 32. A channel-stop region 33 is provided between the photodiode sections 30 to prevent mixing of signal charge. A channel-stop region 33 is also provided between the photodiode section 30 and the vertical CCD register 32, excluding the transfer gate 31, to prevent leakage of signal charge from the photodiode section 30 to the vertical CCD register 32. One end of the vertical CCD register 32 is connected to a horizontal CCD register 34, which in turn has one end connected to a charge detecting section 35.

Referring to FIG. 2, the channel-stop region 33, photodiode section 30, transfer gate 31, vertical CCD register 32 and channel-stop region 33 are provided in the order mentioned from the left hand side in correspondence to FIG. 1. An N-type semiconductor substrate 1 of silicon has a P-well 2 contiguous to its principal surface. In the photodiode section 30, an N-type charge storage region 3 is formed, which forms a PN-junction with the P-well 2 and stores signal charge generated by incident light. The surface of the charge storage region 3 is covered by a P-type surface layer 4 which has a high acceptor concentration so that increase in dark current, which is caused by depletion in the interface between the silicon of the photodiode section 30 and silicon oxide film 11, is prevented.

The vertical CCD register 32 has an N-type buried layer 6 and transfer electrodes (one of which is shown at 10) of highly phosphorus-doped polysilicon film. The transfer electrodes are formed over the surface of the buried layer 6 with a gate oxide film 9 interposed therebetween. A reverse bias for preventing blooming is applied between the N-type semiconductor substrate 1 and P-well 2. To avoid influence of this reverse bias on the operation of the vertical CCD register 32, a P-type register well 5 is formed under the buried layer 6. The register well 5 also functions as a barrier to prevent any unnecessary charge, such as smear or dark current generated in the P-well 2, from flowing into the buried layer 6.

The transfer gate 31 is formed between the photodiode section 30 and vertical CCD register 32. The transfer gate 31 has a boron-doped threshold voltage control region 8 of P-type for controlling the threshold voltage. It also has a transfer gate electrode 20 of highly phosphorus-doped polysilicon film formed over the surface of the region 8 with the gate oxide film 9 interposed. In the illustrated structure, the transfer electrode 10 of the vertical CCD register 32 also serves as the transfer gate electrode 20 of the transfer gate 31. However, it is possible to provide both electrodes independently. The channel-stop region 33 is provided between the photodiode section 30 and vertical CCD register 32. This channel-stop region 33 has a highly boron-doped channel-stop P-type region 7 formed in the neighborhood of the surface of the P-well 2. A photo-shield film 12 of such metal as aluminum and tungsten covers the above structure except the photodiode section 30.

In this solid-state image sensor, signal charges stored in the photodiode section 30 according to incident light are transferred via the transfer gate 31 to the vertical CCD register 32. After the signal charges have been transferred to the vertical CCD register 32, the transfer gate 31 is closed, and the photodiode section 30 accumulates the next cycle signal charges.

The signal charges transferred to the vertical CCD register 32 are transferred in parallel in the vertical direction, that is, they are transferred to the horizontal CCD register 34 for every horizontal line of each vertical CCD register 32. The signal charges transferred to the horizontal CCD register 34 are transferred in the horizontal direction before the transfer of the next signal charges from the vertical CCD register 32. The horizontally transferred signal charges are taken out as a signal from a charge detecting section 35 to the outside.

In the CCD image sensor, increase in the number of pixels to accomplish resolution improvement or reduction in image area to accomplish size reduction makes it necessary to reduce pixel size. In such situations, plane-wise length such as channel length of transfer gate 31 is reduced. In the photodiode section 30, however, light absorption length in the silicon is a physical constant which cannot be reduced. Therefore, it is impossible to reduce the structure in the depth direction because it is necessary to maintain an appropriate spectral response. Therefore, reduction of the channel length of the transfer gate 31 is difficult because ordinary MOSFET scaling rules cannot be applied. More specifically, for the reasons that the storage region 3 corresponding to a source has a large junction depth and that the P-type surface layer 4 is provided, if the channel length is large, there is a surface channel mode in which charge flows along the interface between silicon and silicon oxide films, i.e., the interface between the threshold voltage control region 8 and the gate oxide film 9. However, with reduction in the channel length, the charge read-out channel is shifted into inside the substrate, making it difficult to provide the surface channel mode. The modulation degree $\Delta\phi/\Delta V_{TG}$ of the channel potential $\phi$ with the voltage $V_{TG}$ on the transfer gate electrode is thus reduced. To read signal charge so as to obtain complete depletion of the storage region 3, the channel potential on the surface channel of the transfer gate 31 is increased. This leads to the drawback of increasing the voltage applied on the transfer gate electrode 20.

In addition, bulk punchthrough may occur between the storage region 3 and the buried layer 6.

Positive utilization of the bulk punchthrough in a transfer gate has been proposed in Ozaki et al, "A High Packing Density Pixel with Punchthrough Read-Out Method for an HDTV Interline-CCD", IEEE Workshop on Charge Coupled Devices and Advanced Image Sensors. Further, an example in FIG. 3 of Japanese Patent Application Kokai Publication No. Hei 5-82770 shows that charge is caused to flow through the bulk of a transfer gate by punchthrough. However, no particular novel idea is shown in connection with the impurity distribution in the semiconductor substrate region of the transfer gate in the above example of Ozaki et al. In the example of the Japanese Patent Application Kokai Publication No. Hei 5-82770, FIG. 3 therein illustrates the semiconductor substrate region of the transfer gate as being P+, P, P− and P−− and, thus, the acceptor concentration in the semiconductor substrate region of the transfer gate is reduced monotonously in the depth direction from the surface.

Since these arrangements utilize punchthrough that takes place in the substrate, it is inevitably difficult to make the necessary control by the transfer gate electrode voltage. In addition, the read-out voltage may not be sufficiently reduced.

SUMMARY OF THE INVENTION

An object of the invention, therefore, is to overcome the problems existing in the prior art and to provide a solid-state imaging device which permits ready read-out in a transfer gate bulk channel, permits channel length reduction and permits reduction of voltage applied on the transfer electrode.

Another object of the invention is to provide a structure in which the impurity concentration distribution of the channel region enables the transfer gate channel to be made shorter without an accompanying increase in the applied voltage.

According to one aspect of the invention, there is provided a solid-state image sensor device comprising:

a photodiode section which includes a storage region of a second conductivity type provided in a surface portion of a first conductivity type region of a semiconductor substrate and a surface layer of the first conductivity type formed on the surface of the storage region;

a vertical CCD register which includes a buried layer of the second conductivity type formed in a surface portion of the first conductivity type region and spaced apart a predetermined distance from the storage region and a plurality of transfer electrodes intersecting with the buried layer;

a transfer gate which covers the surface of a semiconductor substrate region between the storage region and the buried layer with a gate insulating film interposed and includes a transfer gate electrode; and a channel control region of the second conductivity type which is provided on the surface of the semiconductor substrate region covered by the transfer gate.

Owing to the effect of punchthrough and also the effect of electric field extending from the transfer gate electrode directly to the channel control region, a charge transfer path may be readily formed in the channel control region of the second conductivity type in the semiconductor substrate region of the transfer gate. Thus, it is possible to realize stable charge read-out. Further, with the provision of the channel control region in the neighborhood of the surface, it is possible to enhance the effect of the electric field extending from the transfer gate electrode and increase the modulation degree ($\Delta\phi/\Delta V_{TG}$) of the channel potential $\phi$ with respect to the voltage $V_{TG}$ applied on the transfer gate electrode. Thus, it is possible to reduce the voltage applied on the transfer gate electrode for charge transfer from the storage region to the buried layer.

BRIEF DESCRIPTION OF THE DRAWINGS

The above and other objects, features and advantages of the present invention will be apparent from the following description of a preferred embodiment of the invention explained with reference to the accompanying drawings, in which.

PREFERRED EMBODIMENT OF THE INVENTION

Now, an embodiment of the invention will be described with reference to the drawings.

Figure 1:
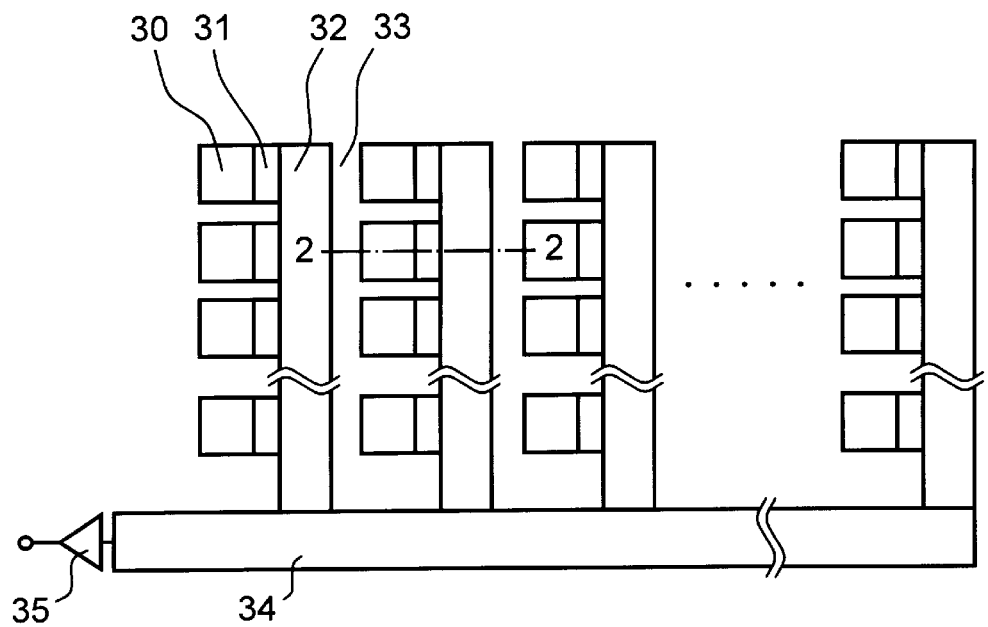
FIG. 1 is a plan view showing an essential part of a prior art solid-state imaging device.
Figure 2:
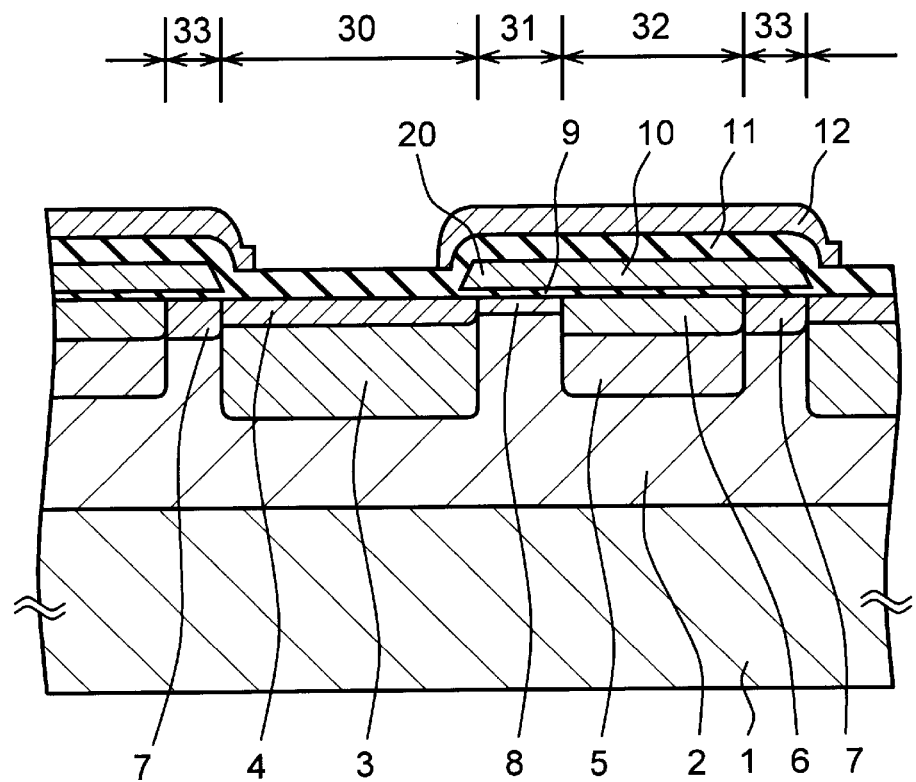
FIG. 2 is a sectional view showing an essential part of the prior art solid-state imaging device taken along line 2—2 in FIG. 1.
Figure 3:
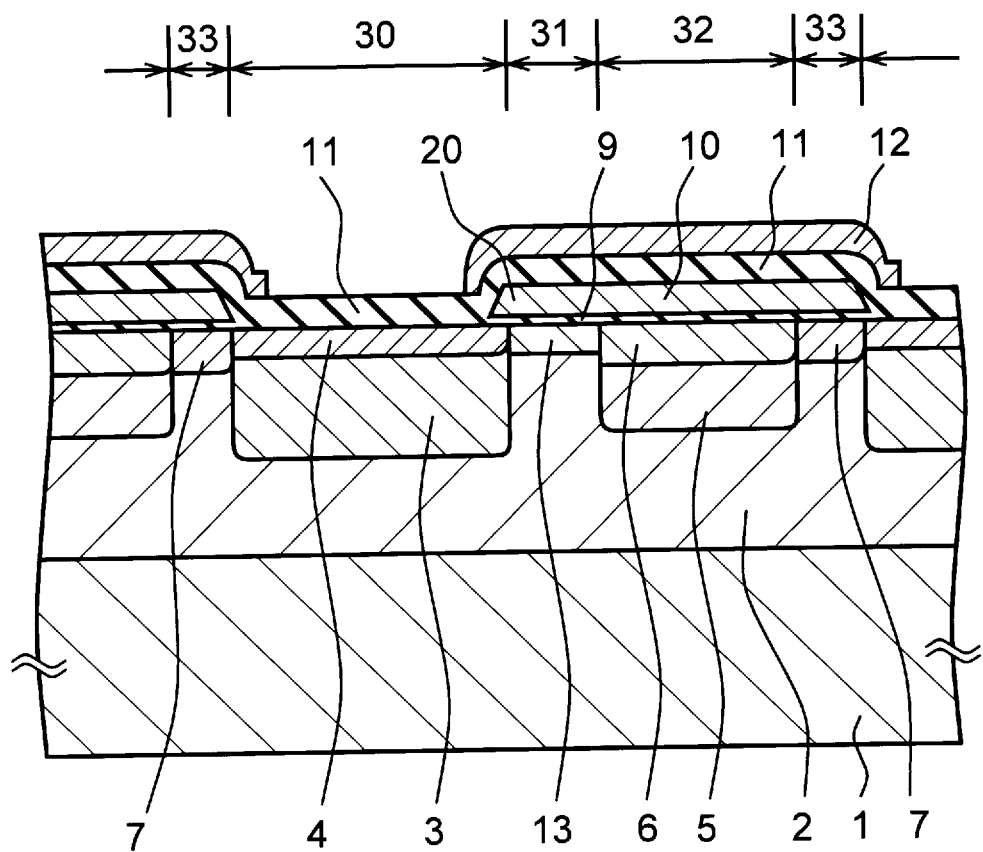
FIG. 3 is a sectional view showing an essential part of a solid-state imaging device of an embodiment according to the invention.

This embodiment of the solid-state imaging device of the invention is the same in plan view as in FIG. 1. FIG. 3 shows a sectional view of the same which corresponds to FIG. 2.

In this embodiment, the solid-state imaging device comprises a photodiode section 30 which includes an N-type storage region 3 provided in a P-well 2 as a surface region of the N-type semiconductor substrate 1 of silicon and a surface layer 4 provided on a surface of the storage region 3. The solid-state imaging device also comprises a vertical CCD register 32 which includes an N-type buried layer 6 formed as a surface region of the P-well 2 with a predetermined distance being provided from the storage region 3 of the photodiode section 30 and a plurality of transfer electrodes (one of which is represented by 10) intersecting the N-type buried layer 6. The solid-state imaging device further comprises a transfer gate 31 which includes a transfer gate electrode (i.e., overhang portion 20 of the transfer electrode 10) extending, with a gate oxide film 9 being interposed, over the surface of a semiconductor substrate region disposed between the storage region 3 and the buried layer 6. Within this arrangement, the impurity distribution of the channel region is such that an N−-type channel control region 13 is provided in the surface region of the semiconductor substrate region of the transfer gate 31. The structure is the same as the prior art structure except that the N−-type channel control region 13 is provided in lieu of the threshold voltage control region 8 (which is usually of higher P-type concentration than the P-well 2).

The channel-stop region 33 is grounded, and a positive voltage is applied on the N-type semiconductor substrate 1. In the transfer of signal charges in the vertical CCD register 32, the drive pulse applied on the transfer electrode 10, etc. is one which swings negatively from the ground potential, and the buried layer 6 is biased to a positive potential (for instance about 3 to 10 volts). The storage region 3 is held at a positive potential (for instance about 5 to 10 volts). The threshold voltage $V_{TH}$ of the MOSFET constituting the transfer gate 31 is a function of the potential on the storage region 3, and is greater than the threshold voltage $V_{TH}(0)$ when the storage region 3 is at the ground potential. It is thus possible to obtain operation in enhancement mode even with a depletion type in which $V_{TH}(0)$ is negative. The threshold voltage $V_{TH}$ becomes a minimum when the potential on the storage region 3 becomes a minimum. This occurs when the storage region is saturated and the vertical overflow drain structure is "on". Thus, it is possible to store charge when $V_{TH}(V_{SAT})>0$. Here, $V_{SAT}$ is a potential on the storage region 3 when the storage region is saturated. The depth and concentration of the channel control region 13 may be suitably set in the ranges satisfying the condition $V_{TH}(V_{SAT})>0$.

Charge is read out (i.e., transferred) from the storage region 3 to the buried layer 6 via the bulk of the N⁻-type channel control region 13. In the state in which the charge read-out voltage is applied on the transfer gate electrode 20, the charge read-out channel is formed by two effects, i.e., the effect of punchthrough owing to increase in the potential on the buried layer 6 and effect of the electric field extending from the transfer gate electrode 20 in the transfer gate 31 with a MOS structure toward the N⁻-type channel control region 13.

With the provision of the channel control region 13, the charge read-out channel is stabilized. In addition, with the provision of the channel control region 13 in the neighborhood of the surface, it is possible to increase the modulation degree ($\Delta\phi/\Delta V_{TG}$) of the charge read-out channel potential $\phi$ with respect to the voltage $V_{TG}$ applied on the transfer gate electrode 20. Thus, it is possible to reduce the voltage $V_{TG}$ applied on the transfer gate electrode $V_{TG}$ for the read-out of charge from the storage region 3 to the buried layer 6. In other words, the gate length of the transfer gate that is necessary for ensuring necessary read-out voltage can be reduced, thus permitting an increase in area of the photodiodes or vertical CCD registers in order to improve sensitivity or amount of saturation signal.

While the above description relates to the vertical overflow drain structure for blooming prevention, the same effects of the invention are also obtainable with a different structure, i.e., with the use of a P-type semiconductor substrate in lieu of providing the P-well in the principal surface portion of the N-type semiconductor substrate.

Further, while the above description is concerned with an interline transfer CCD image sensor, the same effects are obtainable with a frame interline transfer CCD image sensor having the same pixel structure.

As has been described in the foregoing, according to the invention it is possible, with the channel control region of the second conductivity type provided at a surface portion of the semiconductor substrate region of the transfer gate, to readily form the charge read-out channel for reading out charge from the storage region into the buried layer so as to be closer to the semiconductor substrate surface. Thus, it is possible to reduce read-out voltage or reduce the gate length of the transfer gate.

While the invention has been described in its preferred embodiments, it is to be understood that the words which have been used are words of description rather than limitation and that changes within the purview of the appended claims may be made without departing from the true scope spirit of the invention as defined by the claims.

What is claimed is:

1. A solid-state image sensor device comprising:

a photodiode section including a storage region of a second conductivity type provided in a surface portion of a first conductivity type region of a semiconductor substrate and a surface layer of the first conductivity type formed on a surface of the storage region;

a vertical CCD register including a buried layer of the second conductivity type formed in another surface portion of said first conductivity type region and spaced apart a predetermined distance from said storage region, and a plurality of transfer electrodes intersecting with said buried layer;

a transfer gate covering a surface of a semiconductor substrate region between said storage region and said buried layer with a gate insulating film interposed and including a transfer gate electrode; and a channel control region of the second conductivity type covering an entirety of the surface of the semiconductor substrate region between said storage region and said buried layer covered by said transfer gate so as to permit a charge transfer path to form within said channel control region in operation of said device, said charge transfer path being in a portion of said channel control region neighboring said surface of said semiconductor substrate region.

2. A solid-state image sensor device according to claim 1, in which said first conductivity type is P-type and said second conductivity type is N-type.

3. A solid-state image sensor device according to claim 1, in which a bottom of the storage region is spaced apart from the surface of the semiconductor substrate by a distance larger than a distance from the surface of the semiconductor substrate to a bottom of the buried layer.

* * * * *